United States Patent
Buschbeck et al.

(10) Patent No.: US 8,118,932 B2
(45) Date of Patent: Feb. 21, 2012

(54) TECHNIQUE FOR MONITORING DYNAMIC PROCESSES IN METAL LINES OF MICROSTRUCTURES

(75) Inventors: Joerg Buschbeck, Dresdne (DE); Eckhard Langer, Radebeul (DE); Marco Grafe, Dresden (DE)

(73) Assignee: Advanced Micro Devices, Inc., Austin, TX (US)

( * ) Notice: Subject to any disclaimer, the term of this patent is extended or adjusted under 35 U.S.C. 154(b) by 1258 days.

(21) Appl. No.: 11/420,159

(22) Filed: May 24, 2006

(65) Prior Publication Data

US 2007/0044710 A1 Mar. 1, 2007

(30) Foreign Application Priority Data

Aug. 31, 2005 (DE) .......................... 10 2005 041 313

(51) Int. Cl.
*C30B 1/02* (2006.01)
(52) U.S. Cl. ..................... 117/4; 117/8; 117/9; 117/201; 117/202
(58) Field of Classification Search .................. 117/4, 7, 117/8, 9, 201, 202
See application file for complete search history.

(56) References Cited

U.S. PATENT DOCUMENTS

| | | | | |
|---|---|---|---|---|
| 5,804,980 A * | 9/1998 | Nikawa | ........................ | 324/752 |
| 5,929,645 A * | 7/1999 | Aton | .............................. | 324/751 |
| 5,952,837 A * | 9/1999 | Koyama | ......................... | 324/752 |
| 6,121,059 A * | 9/2000 | Liu | .................................. | 438/14 |
| 6,154,039 A * | 11/2000 | Wu | ................................. | 324/752 |
| 6,509,198 B2 * | 1/2003 | Jaw et al. | ........................ | 438/14 |
| 6,953,755 B2 * | 10/2005 | Meyer et al. | ................... | 438/795 |
| 7,115,866 B1 * | 10/2006 | Kroeze et al. | ................. | 250/310 |
| 7,202,689 B2 * | 4/2007 | Condon et al. | ................ | 324/763 |
| 7,385,686 B2 * | 6/2008 | Shiba et al. | ................ | 356/237.1 |
| 2004/0263830 A1* | 12/2004 | Shiba et al. | ................ | 356/237.1 |
| 2005/0072919 A1* | 4/2005 | Meyer et al. | ................... | 250/307 |
| 2008/0268265 A1* | 10/2008 | Meyer et al. | ................... | 428/457 |

FOREIGN PATENT DOCUMENTS

DE 196 09 521 A1 3/1996
DE 103 46 026 A1 5/2005

OTHER PUBLICATIONS

Kiyoshi Nikawa, et al. "New Capabilities of OBIRCH Method for Fault Localization and Defect Detection" IEEE 1997.
Kazuhiro Hoshino "Early Increase in Resistance during Electromigration in A1Cu-plugged Via Structures" Jpn. J. Appl. Phys. vol. 39 (2000).

* cited by examiner

*Primary Examiner* — Bob M Kunemund
(74) *Attorney, Agent, or Firm* — Williams, Morgan & Amerson, P.C.

(57) ABSTRACT

By locally heating specific scan positions within a region of interest and automatically obtaining respective measurement data in a time-resolved and spatially-resolved fashion, dynamic processes within a metallization layer of semiconductor devices may be efficiently monitored and/or modified. For instance, OBIRCH and SEI techniques may be used in combination with the automated data recording and manipulation, thereby providing an efficient means for in situ failure analysis, defect identification, for any dynamic degradation processes in interconnects and interlayer dielectrics.

16 Claims, 2 Drawing Sheets

TECHNIQUE FOR MONITORING DYNAMIC PROCESSES IN METAL LINES OF MICROSTRUCTURES

BACKGROUND OF THE INVENTION

1. Field of the Invention

Generally, the present invention relates to the formation of microstructures, such as advanced integrated circuits, and, more particularly, to the formation and examination of interconnect structures, such as metal lines, and their characteristics during stress conditions.

2. Description of the Related Art

In the fabrication of modern microstructures, such as integrated circuits, there is a continuous drive to steadily reduce the feature sizes of microstructure elements, thereby enhancing the functionality of these structures. For instance, in modern integrated circuits, minimum feature sizes, such as the channel length of field effect transistors, have reached the deep sub-micron range, thereby increasing performance of these circuits in terms of speed and/or power consumption. As the size of individual circuit elements is reduced with every new circuit generation, thereby improving, for example, the switching speed of the transistor elements, the available floor space for interconnect lines electrically connecting the individual circuit elements is also decreased. Consequently, the dimensions of these interconnect lines may have to be reduced to compensate for a reduced amount of available floor space and for an increased number of circuit elements provided per unit die area. The reduced cross-sectional area of the interconnect lines, possibly in combination with an increase of the static power consumption of extremely scaled transistor elements, may require a plurality of stacked metallization layers to meet the requirements in view of a tolerable current density in the metal lines.

Advanced integrated circuits, including transistor elements having a critical dimension of 0.1 μm and even less, may, however, require significantly increased current densities in the individual interconnect lines, despite the provision of a relatively large number of metallization layers, owing to the significant number of circuit elements per unit area that are operated at high operating frequencies. Operating the interconnect lines at elevated current densities, however, may entail a plurality of problems related to stress-induced line degradation, which may finally lead to a premature failure of the integrated circuit. One prominent phenomenon in this respect is the current-induced material transportation in metal lines, also referred to as "electromigration," which may lead to the formation of voids within and hillocks next to the metal line, thereby resulting in reduced performance and reliability or complete failure of the device. For instance, aluminum lines embedded into silicon dioxide and/or silicon nitride are frequently used as metal for metallization layers, wherein, as explained above, advanced integrated circuits having critical dimensions of 0.18 μm or less, may require significantly reduced cross-sectional areas of the metal lines and, thus, increased current densities, which may render aluminum less attractive for the formation of metallization layers.

Consequently, aluminum is increasingly being replaced by copper which has a significantly lower resistivity and exhibits non-negligible electromigration effects at considerably higher current densities compared to aluminum. The introduction of copper into the fabrication of microstructures and integrated circuits comes with a plurality of severe problems residing in copper's characteristic to readily diffuse in silicon dioxide and a plurality of low-k dielectric materials. To provide the necessary adhesion and to avoid the undesired diffusion of copper atoms into sensitive device regions, it is, therefore, usually necessary to provide a barrier layer between the copper and the dielectric material in which the copper lines are embedded. Although silicon nitride is a dielectric material that effectively prevents the diffusion of copper atoms, selecting silicon nitride as an interlayer dielectric material is less then desirable, since silicon nitride exhibits a moderately high permittivity, thereby increasing the parasitic capacitances of neighboring copper lines. Hence, a thin conductive barrier layer that also imparts the required mechanical stability to the copper is formed so as to separate the bulk copper from the surrounding dielectric material, and only a thin silicon nitride or silicon carbide or nitrogen-enriched silicon carbide layer in the form of a capping layer is frequently used in copper-based metallization layers. Currently, tantalum, titanium, tungsten and their compounds with nitrogen and silicon and the like are preferred candidates for a conductive barrier layer, wherein the barrier layer may comprise two or more sub-layers of different composition so as to meet the requirements in terms of diffusion suppressing and adhesion properties.

Another characteristic of copper significantly distinguishing it from aluminum is the fact that copper may not be readily deposited in larger amounts by chemical and physical vapor deposition techniques, in addition to the fact that copper may not be efficiently patterned by anisotropic dry etch processes, thereby requiring a process strategy for the formation of metallization layers that is commonly referred to as the damascene or inlaid technique. In the damascene process, a dielectric layer is formed which is then patterned to include trenches and vias which are subsequently filled with copper, wherein, as previously noted, prior to filling in the copper, a conductive barrier layer is formed on sidewalls of the trenches and vias. The deposition of the bulk copper material into the trenches and vias is usually accomplished by wet chemical deposition processes, such as electroplating and electroless plating, thereby requiring the reliable filling of vias with an aspect ratio of 5 and more with a diameter of 0.1 μm or even less in combination with trenches having a width ranging from 0.1 μm to several μm. Although electrochemical deposition processes for copper are well established in the field of electronic circuit board fabrication, a substantially void-free filling of high aspect ratio vias is an extremely complex and challenging task, wherein the characteristics of the finally obtained copper metal line significantly depend on process parameters, materials and geometry of the structure of interest. Since the geometry of interconnect structures is substantially determined by the design requirements and may, therefore, not be significantly altered for a given circuit layout, it is of great importance to estimate and control the impact of materials, such as conductive and non-conductive barrier layers, of the copper microstructure and their mutual interaction on the characteristics of the interconnect structure so as to insure both high yield and the required product reliability. In particular, it is important to identify and monitor degradation and failure mechanisms in interconnect structures for various configurations so as to maintain device reliability for every new device generation or technology node.

Accordingly, a great deal of effort has been invested in investigating the degradation of copper lines, especially in view of electromigration and stress migration, in order to find new materials and process strategies for forming copper metal lines. Although the exact mechanism of electromigration in copper lines is still not quite fully understood, it turns out that voids positioned in and on sidewalls and interfaces, large bulk voids and residuals at the via bottom, may have a significant impact on production yield and reliability. Except for gross failures, such defects in vias and metal lines, which may be provided as control monitor structures in wafer scribe lines, are difficult to detect in standard electrical testing procedures.

Since advanced microstructures, such as fast microprocessors, may require an increased interconnect complexity with dense metal structures at extremely reduced dimensions and many inspection techniques are already pushed to their limits or require significant time and effort in view of sample preparation and setup, such as SEM (scanning electron microscopy) techniques, there exists a need for enhanced or alternative techniques to examine and/or monitor and/or control materials and process technologies involved in the fabrication of complex interconnect structures.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

Generally, the present invention is directed to a technique that enables the examination of one or more characteristics of a conductive interconnect structure in a substantially non-destructive manner, wherein the data acquisition and the control of any environmental conditions may be performed on an automated basis. Therefore, measurement data may be obtained in a highly efficient manner, thereby providing high statistical significance so as to enable an in situ failure analysis, as well as the location, study and identification of degradation processes in backend structures, such as copper-based interconnects. Moreover, the formation of leakage paths in corresponding backend structures of highly advanced integrated circuits may be identified on the basis of specified environmental conditions. For this purpose, measurement data may be automatically generated and collected, wherein specific portions of an interconnect structure are locally heated and respective changes in the electrical behavior are automatically detected and recorded in a timed fashion so as to allow the monitoring of dynamic processes.

According to one illustrative embodiment of the present invention, a method comprises, during a first time slot, automatically performing a first sequence of actions. The sequence comprises scanning a locally restricted heating spot across a portion of a metallization layer of a semiconductor device, wherein the metallization layer comprises a metal region. Moreover, the sequence includes determining a position of the heating spot at least for some scanned positions, and applying a bias voltage to the portion of the metallization layer. Moreover, the sequence comprises detecting a current flow through the portion of the metallization layer for each scan position and also includes the recording of measurement data representing the current flow for each scan position as a first data set.

According to another illustrative embodiment of the present invention, a method comprises obtaining a sequence of images, each depicting a portion of a metallization layer of a semiconductor device. The method further comprises, for each of the images, scanning across the portion with a localized heating spot to locally heat a plurality of scan positions, obtaining data indicating a current flow within the portion for each of the scan positions and manipulating each data corresponding to a specified one of the scan positions on the basis of the data corresponding to the specified scan position.

Moreover, the method comprises estimating a dynamic behavior of the portion of the metallization layer on the basis of the sequence of manipulated images.

According to yet another illustrative embodiment of the present invention, a system for treating and monitoring a metallization layer of a semiconductor device comprises a heating source configured to provide a locally restricted heating spot. The system further comprises a scanner configured to scan the locally restricted heating spot across a portion of the metallization layer. Moreover, a current probe is provided and is configured to be connected to the portion of the metallization layer and is further configured to detect an electric characteristic indicating a current flowing through a current path in the portion. Finally, the system comprises a controller that is operatively connected to the heating source, the scanner and the current probe for controlling the heating source, the scanner and the current probe. The controller is configured to determine a position of the locally restricted heating spot on the portion of the metallization layer and to obtain and store a plurality of data sets. Hereby, each individual data set corresponds to a respective time slot and each respective item of an individual data set represents a current value in the current path obtained for a scan position that is associated with the respective item.

BRIEF DESCRIPTION OF THE DRAWINGS

The invention may be understood by reference to the following description taken in conjunction with the accompanying drawings, in which like reference numerals identify like elements, and in which:

FIG. 1b schematically shows a top view of the semiconductor device of FIG. 1a;

While the invention is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present invention will now be described with reference to the attached figures. Various structures, systems and devices are schematically depicted in the drawings for purposes of explanation only and so as to not obscure the present invention with details that are well known to those skilled in the art. Nevertheless, the attached drawings are included to describe and explain illustrative examples of the present invention. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

Generally, the present invention is directed to a technique for monitoring interconnect structures in semiconductor devices, wherein, in some illustrative embodiments, characteristics of the interconnect structure, such as the crystallinity thereof, may be also modified. Hereby, the measurement and data acquisition process is automated, thereby providing the potential for gathering an appropriate amount of measurement data within short time periods to allow the monitoring and evaluation of highly dynamic processes in the interconnect structure. Since the technique is non-destructive, corresponding measurement results may be obtained even during the manufacturing sequence, thereby enabling a highly efficient in situ failure analysis, wherein corresponding failure data may also be used for the further process control. Moreover, the present invention is based on the concept of scanning a locally restricted heating spot across a region of interest of an interconnect structure using automatic scan operation and data acquisition control for obtaining a desired degree of "time resolution" required for assessing the dynamic behavior of the region of interest. Due to the concept of scanning a locally restricted heating spot across a specified region of interest, well-established techniques, such as the OBIRCH method (optical beam induced resistivity change) and the SEI method (Seebeck effect imaging) may be used and correspondingly adapted so as to enable the generation of a desired measurement data. In both methods, a laser beam may be used to locally heat a contacted electrical current path in a region of interest, thereby causing a local resistivity change (OBIRCH) or a Seebeck effect (SEI), thus, in both techniques, the resistivity change or the Seebeck effect may cause a change of the electric current flowing through the contacted electrical current path. This change of the electrical current may be detected and may be used for illustrating characteristics of the current path by synchronously scanning the optical beam with respect to the measurement process for the detecting of the change in the electric current. However, as will be explained later on, other techniques may be used in accordance with the present invention to scan a locally restricted heating spot across a region of interest for detecting dynamic processes and/or modifying characteristics of the region of interest.

It should be noted that the present invention is particularly advantageous in the context of copper-based interconnect structures, since these structures will preferably be used in advanced microstructures, such as fast microprocessors, wherein the problem of electromigration may significantly impact further developments in fabricating sophisticated integrated circuits and may also have a significant influence on production yield and overall production costs. The principles of the present invention may, however, be readily applied to any microstructure of interest including respective metal regions, in which stress-induced material transport phenomena may significantly influence the operation and the reliability of the microstructure. For convenience, any such metal-containing structures will be referred to as a metallization layer or interconnect structure, wherein a specific configuration of such a metallization layer or interconnect structure may not be restricted to any specific arrangement, unless such restrictions are specifically pointed out in the detailed description and the appended claims. Consequently, stress-induced migration problems may effectively be investigated for any type of interesting conductive material, such as metals, metal alloys or metal compounds, used in present and future microstructure systems for a variety of stress conditions, due to the efficient creation and gathering of appropriate measurement data.

As is well known, the degradation of inlaid, i.e., embedded, metal lines is related to a directed material transport within the line. The gradient of the electrical potential gives migrating atoms a preferred direction to the anode. Local temperature peaks caused by increased electrical current densities lead to temperature gradients during operation of a microstructure device and therefore, additionally, thermal migration is closely connected with electromigration. It has further been proposed that mechanical stress gradients may preferably be expected for via/line structures, which therefore require increased efforts in investigating stress-induced material transport effects, since the formation of barrier layers in vias and the filling in of copper is a quite critical process sequence and may significantly contribute to the behavior of the interconnect structure. Consequently, the present invention provides the possibility of a highly sensitive process control or monitoring or modifying mechanism based on a large amount of data to produce statistically relevant conclusions, and also provides an effective possibility to study solid state physical degradation mechanisms for representative samples to enhance the understanding of weaknesses in the interconnect technology and to reduce the reliability-related failures in interconnect structures. Moreover, other failure mechanisms, such as the temporary or permanent creation of new current paths under specified operating or stress conditions, may be efficiently detected, due to the possibility of efficiently monitoring increased portions of the metallization layer due to the "top view" used in this technique. Thus, the interconnect structure may be monitored in a fully embedded configuration, wherein specified stress conditions may be established while monitoring at least one electrical characteristic of the interconnect structure. Moreover, since the measurement data automatically created and recorded may then be used to manipulate simultaneously generated image data of the region of interest, a high degree of visibility of the corresponding dynamic behavior of the region of interest may be gained, thereby significantly enhancing the detectability of any failure mechanisms and the like.

Figure 1A:
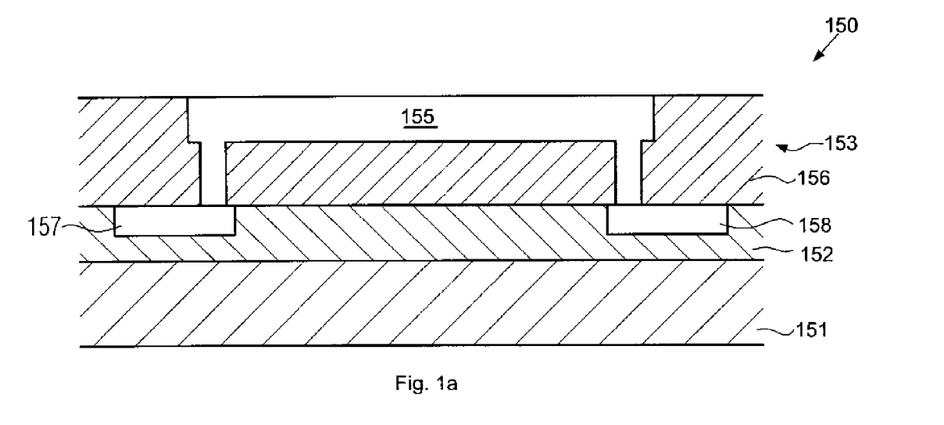
FIG. 1a schematically shows a cross-sectional view of a semiconductor device including an interconnect structure whose characteristics are to be monitored and/or modified.

With reference to FIGS. 1a-1d and 2, further illustrative embodiments of the present invention will now be described in more detail. FIG. 1a schematically shows a cross-sectional view of a microstructure, such as a semiconductor device 150 that comprises a substrate 151, which may represent any appropriate substrate for forming microstructural features therein and thereon. In illustrative embodiments, the substrate 151 may represent a substrate appropriate for the formation of integrated circuits therein and thereon, such as a bulk silicon substrate, a silicon-on-insulator (SOI) substrate, or any other appropriate carrier material having formed thereon crystalline or amorphous semiconductor layers for the formation of circuit elements. Formed above the substrate 151 is a metallization layer 153 that provides an electric connection to an underlying metallization layer or contact layer, which may include a dielectric layer 152 and corresponding metal regions 157 and 158. For example, the dielectric layer 152 may represent an interlayer dielectric layer stack used for passivating any circuit elements, wherein the regions 157, 158 may represent any contact regions of circuit elements, such as drain or source regions of transistors, gate electrodes and the like. In other cases, the dielectric layer 152 and the metal regions 157, 158 may represent a metallization layer of an advanced integrated circuit. A metallization layer 153 may comprise a metal region 155, which may be provided in the form of a metal line with respective vias connecting to the metal regions 157 and 158. Moreover, the metal region 155 may be formed in a dielectric layer 156, which may be comprised of any appropriate dielectric material as is required in accordance with device requirements. For instance, in highly sophisticated integrated circuits, the dielectric layer 156 may represent a layer or layer stack including a high amount of low-k dielectric materials, while the metal region 155 may be comprised of copper or copper alloy. It should be appreciated that, in some illustrative embodiments, the metallization layer 153, possibly in combination with the layer 152 and the metal regions 157, 158, may represent a specifically designed test structure that may be located on a dedicated test substrate 151 or, in other embodiments, the test structure may be formed on specific locations of a product substrate, wherein the test structure, i.e., the metallization layer 153, may have experienced substantially the same manufacturing processes as corresponding metallization layers and interconnect structures of respective product devices. Moreover, the metal region 155 may be connected to appropriately designed contact portions (not shown) that may allow access by means of external current probes. For example, the regions 157, 158 may be designed as contact portions or may be connected to respective contact portions when the characteristics of the metallization layer 153 are to be estimated, for instance, with respect to electromigration, or other stress-induced migration effects.

The semiconductor device 150 as shown in FIG. 1a may be formed in accordance with well-established manufacturing processes, wherein, as previously explained, the metallization layer 153, which may represent a region of interest for subsequent monitoring and/or modifying of characteristics thereof, may be formed in accordance with the same processes as product devices formed on dedicated substrate areas, or the semiconductor device 150 may represent a device that is formed on a dedicated substrate in accordance with specified materials and process conditions so as to estimate the influence of materials and process parameters on the reliability of interconnect structures.

Figure 1B:
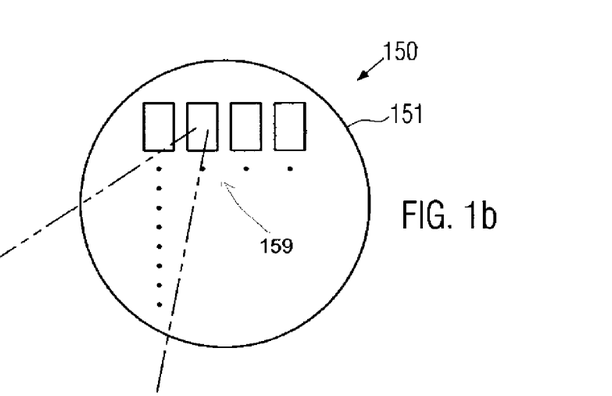

FIG. 1b schematically shows a top view of the semiconductor device 150, wherein a plurality of dies 159 may be formed on the substrate 151, wherein at least some of the dies 159 or a region adjacent to specific dies include the metallization layer 153, as shown in FIG. 1a.

Figure 1C:
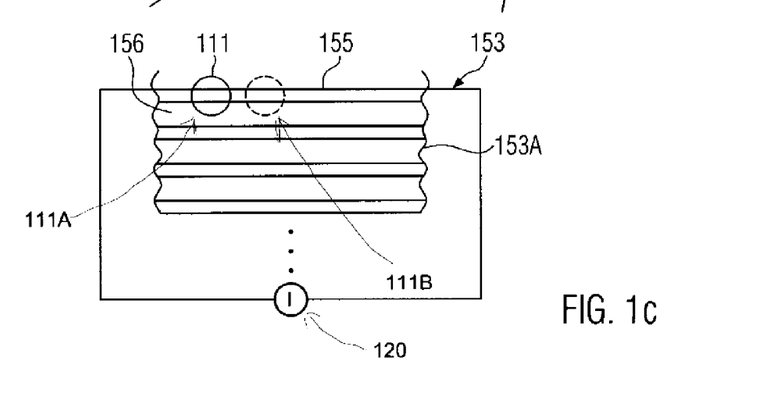
FIG. 1c schematically illustrates in an enlarged view a scan operation with a locally restricted heating spot and the corresponding automated data recording in accordance with illustrative embodiments of the present invention.

FIG. 1c schematically represents an enlarged portion of FIG. 1b, which may include a portion of the metallization layer 153. For example, in highly advanced integrated circuits, a plurality of metal lines are provided in each metallization layer, wherein the metal lines are aligned to each other in a substantially parallel manner, whereas corresponding metal lines of an adjacent lower-lying or higher-lying metallization layer are oriented substantially perpendicular to the metal lines 155 to reduce the parasitic capacitance between neighboring metallization layers. By providing the metallization layer 153 in accordance with the configuration of an actual metallization layer as used in an actual product device, the behavior of the actual product devices under a variety of stress conditions and operating conditions may be evaluated, thereby enabling efficient detection of failure mechanisms and other characteristics of the metallization layers of the product devices. It should be appreciated, however, that the metallization layer 153, especially in view of providing appropriate contact portions, may have any desired configuration and layout as may be considered appropriate for the estimation of characteristics thereof. For example, if the behavior of vias of the metallization layer 153 and its evaluation with respect to failure mechanisms and other electromigration and stress-induced phenomena is of particular interest, the metal region 155 may be formed to include a large number of vias to increase the probability of detecting corresponding electromigration or other stress-induced effects, such as voids, in the vias. However, any other appropriate configuration may also be used, wherein a high degree of design flexibility is provided, since scanning the metallization layer 153 with a locally restricted heating spot may be performed without requiring a special sample preparation.

During the generation of measurement data for evaluating the dynamic behavior of the metallization layer 153, that is, specific portions 153a thereof, it may be contacted and may be connected to a measurement system 120, as will be described in more detail later on with reference to FIG. 1d. Connecting the metallization layer 153 to the measurement system 120 may include, according to illustrative embodiments, contacting one or more of the metal regions 155 by means of respective electric probes so as to enable the measurement of a current flow within one or ore of the metal regions 155. In other embodiments, contacting the metallization layer 153 may comprise the application of a specified bias voltage across specified portions on the metallization layer 153, wherein the respective portion 153a may not necessarily be located in the metal regions 155, but may also comprise specified positions in the dielectric layer 156, when, for instance, reliability tests with respect to shorts etc in dielectric interlayers during thermal/electro/mechanical stability tests are performed. At the same time, the current flowing through one or more of the metal regions 155 may be monitored and/or the voltage and/or current may be monitored, which is applied via the measurement system 120 so as to bias the portion 153a of the metallization layer 153, wherein, for instance, a voltage drop may indicate a current flow and thus a creation of a new current path within the portion of interest 153a of the metallization layer 153. During the monitoring of an electrical characteristic indicating a current flow through the metallization layer 153, or at least the portion 153a thereof, a locally restricted heating spot 111 is scanned across the portion or a region of interest 153a.

It should be appreciated that the locally restricted heating spot 111 may have a dimension that is appropriate to locally heat the area covered by the spot 111 to a sufficiently high temperature to generate a modification of the physical behavior, for instance in the form of a resistance change or a change of the thermo-electric behavior, such as in the above-described Seebeck configuration, and the like. For instance, the heating spot 111 may have an averaged lateral size or diameter in the range of 1 µm to several µm. Moreover, an energy density within the heating spot 111 is selected so as to obtain a significant rise in temperature, for instance in the range of approximately 30-300° C., within a time period in the range of several milliseconds to several seconds. Upon locally heating the area corresponding to the heating spot 111, a physical property, such as the electrical resistance, may also significantly change in the modified portion of the region 153a, wherein a respective change may readily be identified on the basis of an appropriate electrical parameter, such as the current flow. For instance, it may be assumed that the measurement system 120 is electrically connected to the uppermost metal region 155 shown in FIG. 1c, and the resistance of the line 155 is measured in a timely synchronized fashion with respect to scanning the heating spot 111 across the region 153a, thereby locally heating a plurality of scan positions, such as positions 111a and 111b, as shown in FIG. 1c.

During the local heating, the corresponding resistance at the scan position 111a may exhibit a specified value, which significantly depends on the overall characteristics of the metal region 155 within the areas surrounding the scan position 111a. Thus, a representative value for the resistance, that is, the current flow, may be taken and automatically associated with the scan position 111a. Similarly, the heating spot 111 may be moved to the scan position 111b and may thereby at least laterally heat the area of the scan position 111b, while the area around the scan position 111a may return to its equilibrium state, unless the heating procedure may have caused a permanent modification of the metal region 155 within the first scan position 111a. In both cases, corresponding measurement data taken prior to actually heating the region around the scan position 111b may indicate whether or not the first scan position 111a has returned to its equilibrium state or may have suffered a slowly relaxing or permanent modification.

Thereafter, the heating spot 111 at the position 111b may be activated to locally heat the position 111b, thereby also automatically receiving corresponding measuring data for estimating an electric characteristic, such as the resistance of the metal region 155. By appropriately associating each scan position 111a, 111b with the respective measurement data, which may be accomplished by appropriately synchronizing the scan operation with obtaining and storing the corresponding measurement data, a current state of the region 153a with respect to its electrical behavior may be obtained.

Since the entire scan and data acquisition is performed in a timely synchronized and automated fashion, a plurality of subsequent states of the region 153a, each state corresponding to a time slot for gathering the respective set of data, may be monitored and may be compared or displayed or otherwise manipulated so as to estimate the dynamic behavior of the region 153a, which may be highly advantageous when specific stress conditions are simultaneously applied, as will be described in more detail later on. For instance, it may be assumed that stress-induced material transport is occurring within the metal region 155, for instance due to elevated temperatures that may be applied or that may build up during the operation of metallization layer 153. For example, a predefined current may be driven through the metal region 155 or a predefined voltage may be applied to the metal region 155 to generate a current flow depending on the resistance of the region 155. Thus, a stress-induced material transport, such as electromigration, may take place in the metal region 155, wherein the dynamic behavior of the electromigration may be the object of interest of the corresponding test run.

By locally heating specific portions of the region 153a corresponding to the respective scan positions 111a, 111b and the like, the resulting change in current flow may be associated with the respective scan position, for example, the position 111a, so as to evaluate the influence of the specific scan position 111a on the overall current flow. It may be assumed, for instance, that the scan position 111a may not be substantially affected by electromigration yet, while a significant formation of voids may, however, have taken place in the scan position 111b. In this case, the influence of the local heating at the second scan position 111b may be significantly different compared to the effect obtained in the scan position 111a. Thus, the scan position 111b may be identified as a critical position. Since the scan operation and the measurement data acquisition is automatically synchronized in accordance with a desired time resolution and spatial resolution, the dynamic behavior, that is, any changes in the status of the region of interest 153a, may be monitored and recorded, thereby providing an efficient means for detecting and localizing failure mechanisms and other characteristics of metallization layers.

As previously indicated, contacting the region of interest 153a may not necessarily imply contacting one of the metal regions 155 but may comprise the contacting of any specific portions, such as within the dielectric layer 156, wherein the dielectric characteristics of the material 156 may be monitored, for instance when establishing different environmental conditions, such as specified thermal, electrical, mechanical and other stress conditions. By scanning the heating spot 111 in a timely, synchronized fashion across the region 153a and by synchronously taking measurement data and recording the same, the dynamic behavior of the dielectric material 156 including the metal regions 155 may be estimated in a highly efficient process.

Figure 1D:
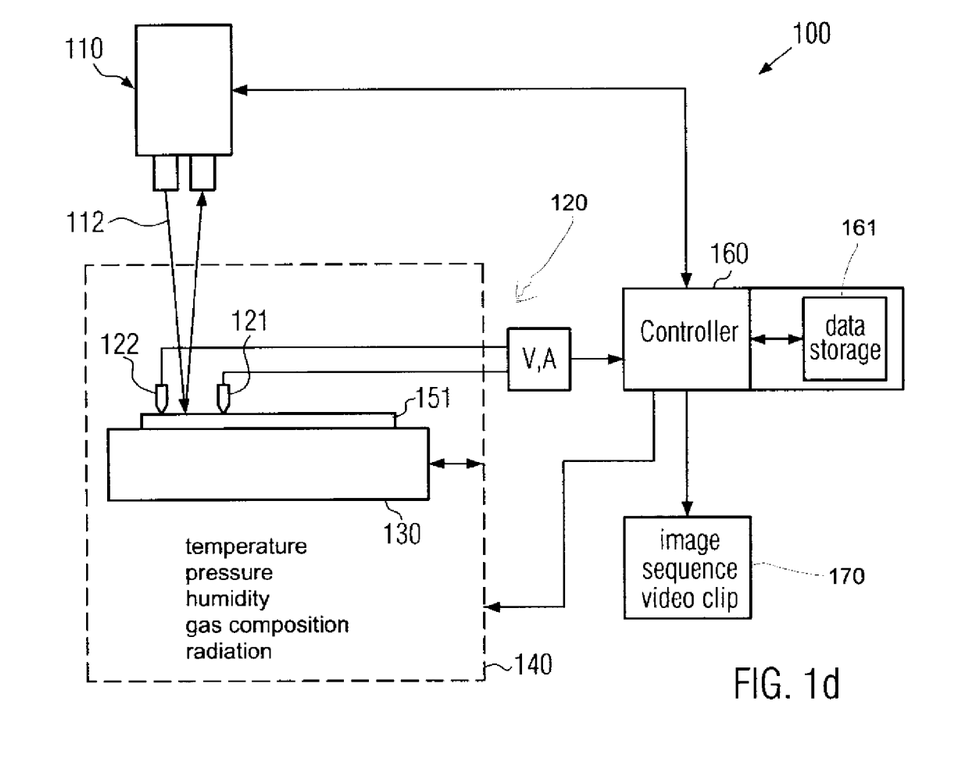
FIG. 1d schematically illustrates a system for monitoring and/or modifying the characteristics of an interconnect structure in a substantially non-destructive manner by using a scanning localized heating spot in accordance with illustrative embodiments of the present invention.

FIG. 1d schematically shows a system 100 for gathering measurement data from a portion of the metallization layer, such as the region 153a, in an automated fashion to enable an efficient in situ failure analysis and monitoring of characteristics of metallization layers. The system 100 may comprise, in illustrative embodiments, components of well-known detection techniques as specified above, i.e., from an OBIRCH and/or SEI technique, in which an optical beam is used to locally heat respective scan positions of the metallization layer. The system 100 may comprise a heating source 110 for producing a locally restricted heating spot, such as the spot 111 as shown in FIG. 1c. In some illustrative embodiments, the heating source 110 may comprise an optical beam source, such as a laser source and appropriate beam optics (not shown) to form an optical beam 112, which produces the locally restricted heating spot 111 at a specific scan position. It should be appreciated that the term "locally restricted heating spot" does not intend to impose any restriction with respect to a penetration depth into the region of interest, but merely refers to a locally restricted lateral size, since some dielectric materials may be more or less transparent for a specified wave-length of the optical beam 112. Consequently, a "vertical" extension of the locally restricted heating spot may depend on the exposure wavelength and the optical characteristics of the material composition of the region of interest 153a.

In some illustrative embodiments, an optical imaging system incorporated in the heating source 110 may be provided to additionally provide image data from the region of interest 153a, which provides the possibility of manipulating the image data on the basis of corresponding measurement data obtained by the local heating of the region of interest 153a. In other illustrative embodiments, the heating source 110 may comprise other efficient heat transfer mechanisms, such as appropriately designed nozzles and the like for transferring a heat transfer medium in a very localized manner onto the region of interest 153a at the various scan positions 111a, 111b. For example, heated inert gas may be used as a heat transfer medium to heat in a very localized manner the respective scan positions.

The system 100 further comprises the measurement system 120, which may include a plurality of electric probes 121, 122 that may be configured to contact specified contact portions within the metallization layer 153. Moreover, the system 100 comprises a substrate holder 130, which may be designed to provide the required scan functionality when the heating source 110 may not provide a movable heating spot. On the other hand, if the heating source 110 may provide scan functionality, the substrate holder 130 may be configured to provide the required functionality with respect to substrate handling and substrate holding, as well as for the application of specified environmental conditions, such as a specified substrate temperature, mechanical stress and the like.

Moreover, in some illustrative embodiments, the system 100 may further comprise an environmental chamber 140 that is designed to enable establishment of specified environmental conditions, which may also be referred to as stress conditions, wherein the temperature and/or the humidity and/or the gas composition and/or the amount and type of high energetic radiation and the like may be adjusted on the basis of specific control signals.

The system 100 further comprises a controller 160 that is operatively connected to the heating source 110, the measurement system 120, the environmental chamber 140 and to the substrate holder 130. Thus, the controller 160 may have implemented therein an appropriately designed control algorithm to coordinate the operation of the above-specified components such that corresponding measurement data, possibly in combination with corresponding image data, may be obtained in synchronism with the scan operation in order to enable the correlation of the measurement data and the position data for estimating the dynamic behavior of the region of interest 153a. To this end, the controller 160 may comprise a data storage section 161 which may be organized such that measurement data, image data and position data received by the controller 160 may be retrieved and manipulated so that corresponding measurement data are related to the associated scan positions.

Moreover, the system 100 may further comprise a data indication unit 170, which may be configured to display or otherwise indicate at least the measurement data obtained from the measurement system 120 in a spatially and timely organized fashion so as to facilitate the estimation of the dynamic behavior of the region of interest 153a. In one illustrative embodiment, the data indication unit 170 may be configured to provide a sequence of images from the region of interest 153a, wherein the image data is manipulated on the basis of corresponding measurement data obtained from the measurement system 120 in order to enhance the visibility of the dynamic behavior of the region of interest 153a. For example, pixel or pixel groups associated with a specific scan position may receive a color corresponding to the value of the measurement data associated with the specific scan position. Thus, the evolution of the region of interest 153a, at least for one specific electrical parameter, such as the current flow through a current path, may be monitored with a high visibility. For instance, the sequence of images may be provided in the form of a video clip, thereby facilitating the detection of even very subtle changes in the state of the region of interest 153a.

During the operation of the system 100, during a first time slot, the first scan position may be locally heated and corresponding measurement data may be selected by the system 120 and provided to the controller 160, which may then store the measurement data along with the corresponding position data. Thereafter, the controller 160 may instruct the substrate holder 130 and/or the heating source 110 to move to a next scan position, wherein, according to a specified time schedule, further measurement data may be gathered and communicated to the controller 160 for storage according to the current position of the locally restricted heating spot. Depending on the spatial resolution and the time resolution required, a plurality of scan positions may be used for correspondingly acquiring measurement data, which are then appropriately stored by the controller 160 along with the respective position data. Thus, measurement data obtained during the first time slot may represent the state of the region of interest 153a at that time for a specified characteristic to be monitored. Similarly, during a second time slot, the sequence may be repeated to obtain corresponding measurement data representing an updated state of the region of interest 153a, wherein the dynamic behavior may then be evaluated on the basis of any changes between the first state and the second state. Advantageously, a plurality of corresponding measurement sets, each corresponding to a specific time slot, may be obtained to enable monitoring of the dynamic behavior of the region of interest 153a in a highly efficient manner. The controller 160 may, in some embodiments, additionally perform a data manipulation process to provide the measurement data in a highly visible fashion, i.e., in the form of images of the region of interest 153a with false colors that correspond to the corresponding measurement data. In this way, any failure mechanisms or other events, and in particular stress-induced material transport phenomena, may be monitored and evaluated. Moreover, in illustrative embodiments, the controller 160 is also configured to appropriately control the environmental conditions for the region of interest 153a within the environmental chamber 140.

Hereby, a high degree of flexibility with regard to any test conditions is accomplished, since complex temperature profiles, stress gradients and other desired environmental conditions may be applied without significantly interfering with the creation of a corresponding scanning heating spot. That is, compared to conventional SEM analysis techniques, the environmental conditions within the chamber 140 may be selected substantially independently from any vacuum requirements relative to conventional techniques. Moreover, as previously explained, depending on the configuration of the corresponding region of interest or metallization layer 153, a contact by the electric probes 121, 122 may be established during various stages of manufacturing, thus facilitating the monitoring of specific characteristics even in a substantially uncompleted stage of the semiconductor device 150, thereby providing a high degree of flexibility and also providing the possibility of producing statistically meaningful in-line measurement results, which may also be used during the further processing of the semiconductor device 150. For example, any test structures may be incorporated, which may allow contacting the test structure after the formation of metal lines in a specified metallization layer, thereby enabling the measurement of electrical characteristics of these metal lines immediately after the manufacturing process, thereby providing feedforward and feedback control data for the manufacturing process flow under consideration. In this sense, the system 100 is configured to provide in situ measurement data for the failure analysis and/or the monitoring of other characteristics of a metallization layer.

Figure 2:
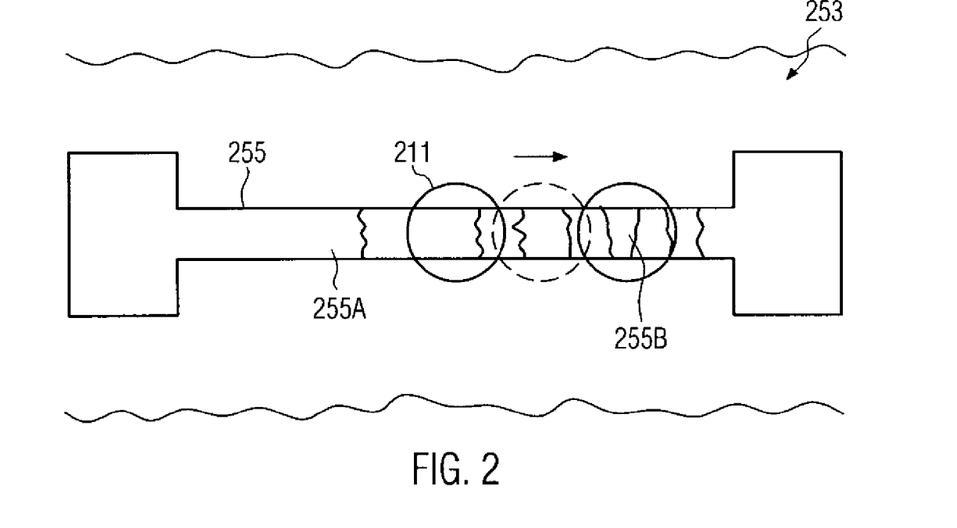
FIG. 2 schematically illustrates a top view of a test structure for automatically monitoring and modifying the characteristics of a metal line in accordance with still other illustrative embodiments.

FIG. 2 schematically shows a region of interest 253, the characteristics of which are to be monitored and modified in accordance with further illustrative embodiments of the present invention. As previously explained, in highly sophisticated semiconductor devices, the current density in the respective metal lines is a critical value and may significantly influence the time to failure, as well as the operating behavior of the device. Thus, it is important to reduce the electrical resistance of respective metal regions for a given device design. For example, the grain size of copper or copper-based metals may significantly determine the overall resistance of the respective metal region as well as the performance with respect to premature failure. For example, in highly scaled integrated circuits, boundaries of individual grains 255a and 255b of a metal region 255 may significantly determine its resistance. Thus, it may be highly advantageous to reduce the number of grain boundaries, which may be accomplished by locally heating the metal region 255 and scan along the length direction so as to reduce the number of grain boundaries therein. Thus, in this case, the system 100, as described above, may also be advantageously used to modify the electrical characteristic of the metal region 255 by performing a directional heating process, in which a locally restricted heating spot 211 is sequentially scanned along the length of the metal line 255 in an overlapping manner so as to re-crystallize the heated portion and "freeze" the re-crystallized structure upon cooling the portion. Thereafter, the process may be repeated with an adjacent portion, which may then take on substantially the same crystalline structure as the previously treated portion, thereby achieving extremely large grains along the length direction of the line 255.

Hereby, the overall growth process for the grains may be monitored and controlled by means of a correspondingly designed system, such as the system 100, in which the controller 160 may, in an automated fashion in accordance with a specific control algorithm, perform the directional crystalline growth and simultaneously monitor its effectiveness. For example, the region of interest 253 may represent a test structure which is heated in the above-explained fashion to determine appropriate process parameters for the treatment of actual device structures. In other embodiments, the system 100 may be configured to simultaneously treat a plurality of metal lines 255, some of which may be configured to allow access by the measurement system 120, to thereby simultaneously obtain corresponding measurement data for estimating the efficiency of the treatment. For example, as previously explained, typically, the metal lines of a specific metallization layer are arranged in parallel and thus a large number or all of the metal lines may be treated simultaneously, by appropriately configuring the heating source, wherein, additionally, in appropriate test structures, corresponding measurement data may be obtained and may be used to estimate the quality of the treatment under consideration. Consequently, a highly efficient control mechanism is provided for improving the electrical behavior of metal lines. As previously explained, the corresponding change of electrical characteristics in the metal line 255 may be efficiently monitored by a corresponding sequence of images or by a respective video clip, thereby also enabling the visualization of the directional crystal growth in one or more metal lines 255.

As a result, the present invention provides an improved technique for the investigation of time-dependent dynamic processes in electrical current paths of a metallization layer. The technique enables the automation of image and data recording and the adjustment of stress and measuring conditions. Parameters, such as bias voltage applied to a region of interest, the current flow through the metal region or any other current path in the region of interest, measuring or stressing times, temperature, the time resolution and the image quality may be used as controlled parameters. Thus, image sequences or video clips may be obtained in a time-resolved manner to facilitate the investigation of dynamic processes, such as the stress-induced migration of interconnect material. Furthermore, applying specific environmental conditions, such as heating the sample in accordance with a desired temperature profile, accelerates the temperature-dependent dynamic processes, such as material transport in current paths, i.e., stress-induced material migration, or to initiate the appearance of new active current paths, such as shorts, etc., for instance in dielectric interlayer materials, thereby offering the possibility of efficiently testing the stability of these materials in terms of their thermal, electrical and mechanical stability. Moreover, contrary to conventional techniques for estimating electromigration effects or interlayer dielectric characteristics, which may only reveal the time to failure, the present invention may be practiced with a wide variety of environmental conditions on structures provided on uncut substrates, wherein dynamic processes may be monitored until failure and wherein created defects may immediately be identified and localized, since very large structures can be simultaneously monitored. Moreover, the characteristics of metal regions and dielectric materials may be locally modified, wherein simultaneously measurement data may be provided so as to evaluate the effectiveness of the material modification.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   during a first time slot, automatically performing a first sequence of actions comprising:
      scanning a locally restricted heating spot generated by an optical beam across a portion of a metallization layer of a semiconductor device, said metallization layer comprising a metal region;
      determining a position of said heating spot at least for some scan positions;
      applying a bias voltage to said portion;
      detecting a characteristic indicating a current flow through said portion of the metallization layer for each of said scan positions; and
      recording measurement data representing said current flow for each scan position as a first data set;
   repeating said first sequence of actions for the same portion of the metallization layer and a second time slot different than said first time slot while maintaining said bias voltage to record measurement data as a second data set; and
   estimating a dynamic behavior of said portion of the metallization layer on the basis of said first and second data sets.

2. The method of claim 1, further comprising obtaining image data representing said portion of the metallization layer and manipulating said image data on the basis of said first and second data sets so as to visually display a dynamic behavior of said portion of the metallization layer.

3. The method of claim 1, wherein said current flow is detected in said metal region.

4. The method of claim 1, further comprising controlling at least one parameter of an environment of said portion while obtaining said first data set.

5. The method of claim 4, wherein said at least one parameter of the environment comprises a parameter for adjusting at least one of a temperature, a humidity, a pressure and a high energy radiation intensity.

6. The method of claim 1, further comprising controlling a length of said first time slot and said second time slot and the time period between said first and second time slots so as to control a time resolution for estimating a dynamic behavior of said portion.

7. The method of claim 1, further comprising controlling at least one of a number of said at least some scan positions, a magnitude of said bias voltage, and a current flow through said metal region.

8. The method of claim 1, wherein said metal region represents a metal line and said locally restricted heating spot is scanned along said metal line in an overlapping manner.

9. The method of claim 8, further comprising controlling said locally restricted heating spot so as to enable a reconfiguration of a crystalline structure of said metal line.

10. A method, comprising:
obtaining a sequence of images each depicting a same portion of a metallization layer of a semiconductor device during a particular time slot, wherein the sequence of images represent different time slots;
for each of said images, scanning across said portion with a localized heating spot generated by an optical beam to locally heat a plurality of scan positions, obtaining data indicating a current flow within said portion for each of said scan positions and manipulating image data corresponding to a specified one of said scan positions on the basis of said data corresponding to said specified scan position; and
estimating a dynamic behavior of said portion of the metallization layer on the basis of the sequence of manipulated images.

11. The method of claim 10, further comprising controlling at least one of an image quality, a time period between two successive images, a measuring time at each scan position, a number of scan positions and a scan speed so as to control a time resolution for estimating said dynamic behavior.

12. The method of claim 10, further comprising applying a predefined stress condition to said portion of the metallization layer while obtaining said sequence of images.

13. The method of claim 12, wherein applying said predefined stress condition comprises generating a predefined temperature progression of said portion during obtaining said sequence of images.

14. The method of claim 12, further comprising controlling a duration of applying said predefined stress condition.

15. A method, comprising:
during a first time slot, automatically performing a first sequence of actions comprising:
scanning a locally restricted heating spot generated by an optical beam across a portion of a metallization layer of a semiconductor device, said metallization layer comprising a metal region;
determining a position of said heating spot at least for some scan positions;
applying a bias voltage to said portion;
detecting a characteristic indicating a current flow through said portion of the metallization layer for each of said scan positions;
recording measurement data representing said current flow for each scan position as a first data set;
controlling said locally restricted heating spot so as to enable a reconfiguration of a crystalline structure of said metal line; and
during a second time slot, automatically performing a second sequence of actions while said bias voltage is maintained, the sequence comprising:
scanning said locally restricted heating spot across said portion of the metallization layer of the semiconductor device;
determining a position of said heating spot for said at least some scan positions;
detecting a current flow through said portion of the metallization layer for each of said scan positions; and
recording measurement data representing said current flow for each scan position as a second data set.

16. The method of claim 15, further comprising estimating a dynamic behavior of said portion of the metallization layer on the basis of said first and second data sets.

* * * * *